(12) United States Patent
Fujie

(10) Patent No.: US 12,114,431 B2
(45) Date of Patent: Oct. 8, 2024

(54) COMPONENT SUPPLY APPARATUS

(71) Applicant: FUJI CORPORATION, Chiryu (JP)

(72) Inventor: Isao Fujie, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 475 days.

(21) Appl. No.: 17/278,988

(22) PCT Filed: Sep. 27, 2018

(86) PCT No.: PCT/JP2018/035989
§ 371 (c)(1),
(2) Date: Mar. 23, 2021

(87) PCT Pub. No.: WO2020/065836
PCT Pub. Date: Apr. 2, 2020

(65) Prior Publication Data
US 2022/0039304 A1     Feb. 3, 2022

(51) Int. Cl.
*H05K 13/02* (2006.01)
*H05K 13/04* (2006.01)
*H05K 13/08* (2006.01)

(52) U.S. Cl.
CPC ......... *H05K 13/028* (2013.01); *H05K 13/022* (2013.01); *H05K 13/0452* (2013.01); *H05K 13/081* (2018.08)

(58) Field of Classification Search
CPC ............... H05K 13/028; H05K 13/022; H05K 13/0452; H05K 13/081
See application file for complete search history.

(56) References Cited

U.S. PATENT DOCUMENTS

| | | | |
|---|---|---|---|
| 6,634,159 B1 * | 10/2003 | Muto | B65B 9/045 53/591 |
| 11,547,032 B2 * | 1/2023 | Hibino | B65G 59/063 |
| 11,672,109 B2 * | 6/2023 | Shibata | H05K 13/0882 29/739 |
| 11,683,922 B2 * | 6/2023 | Kawai | H05K 13/021 29/739 |
| 2009/0049682 A1 * | 2/2009 | Yagi | H05K 13/0452 29/742 |

(Continued)

FOREIGN PATENT DOCUMENTS

| | | |
|---|---|---|
| JP | 7-172580 A | 7/1995 |
| JP | 2003-188591 A | 7/2003 |
| JP | 2010-87358 A | 4/2010 |

(Continued)

OTHER PUBLICATIONS

International Search Report issued on Dec. 11, 2018 in PCT/JP2018/035989 filed on Sep. 27, 2018, 1 page.

*Primary Examiner* — Gene O Crawford
*Assistant Examiner* — Abby A Jorgensen
(74) *Attorney, Agent, or Firm* — Oblon, McClelland, Maier & Neustadt, L.L.P.

(57) ABSTRACT

A component supply device, configured to supply an electrical component in a state of being placed in a placement section, comprising: multiple placement sections, in which an electrical component positioned by a positioning section is placed in each placement section, and a detection device, configured to detect displacement in the up-down direction of the electrical components placed in the multiple placement sections.

6 Claims, 15 Drawing Sheets

(56) References Cited

U.S. PATENT DOCUMENTS

2015/0258687 A1* 9/2015 Taishi .................... B25J 9/1687
                                                              700/228

FOREIGN PATENT DOCUMENTS

| JP | 2017077934 A | * | 4/2017 | |
|----|---|---|---|---|
| JP | 2017103342 A | * | 6/2017 | |
| WO | WO-2012073283 A1 | * | 6/2012 | ............. G01B 11/14 |
| WO | WO-2013157109 A1 | * | 10/2013 | ......... B65H 19/1852 |
| WO | WO-2016046897 A1 | * | 3/2016 | ............. B23P 19/00 |
| WO | WO-2016139742 A1 | * | 9/2016 | ........... H05K 13/022 |

* cited by examiner

COMPONENT SUPPLY APPARATUS

TECHNICAL FIELD

The present application relates to a component supply device for supplying an electrical component in a state of being placed in a placement section.

BACKGROUND ART

There is a component feeder for supplying an electrical component in a state of being placed in a placement section. In such a component feeder, it is desirable to detect the orientation and the like of the placed electrical component. The following Patent Literature describes technologies for detecting the position, orientation, and the like of a component.

PATENT LITERATURE

Patent Literature 1: Japanese Patent Publication No. 2010-87358
Patent Literature 2: Japanese Laid-open Patent Publication No. 7-172580

BRIEF SUMMARY

Technical Problem

It is an object of the present disclosure to suitably detect the orientation and the like of an electrical component placed in a placement section.

Solution to Problem

In order to solve the above problem, the present specification discloses a component supply device, configured to supply an electrical component in a state of being placed in a placement section, comprising: multiple placement sections, in which an electrical component positioned by a positioning section is placed in each placement section, and a detection device, configured to detect displacement in the up-down direction of the electrical components being placed in the multiple placement sections.

Advantageous Effects

According to the present disclosure, each electrical component is placed in a placement section while being positioned by a positioning section. The displacements in the up-down direction of the electrical components placed in the multiple placement sections are then detected by a detection device. As a result, it is possible to suitably detect the orientation and the like of the electrical component placed in each of the placement sections.

DESCRIPTION OF EMBODIMENTS

Hereinafter, as a mode for carrying out the present disclosure, an embodiment of the present disclosure will be described in detail with reference to the drawings.

(A) Configuration of the Component Mounting Machine

Figure 1:
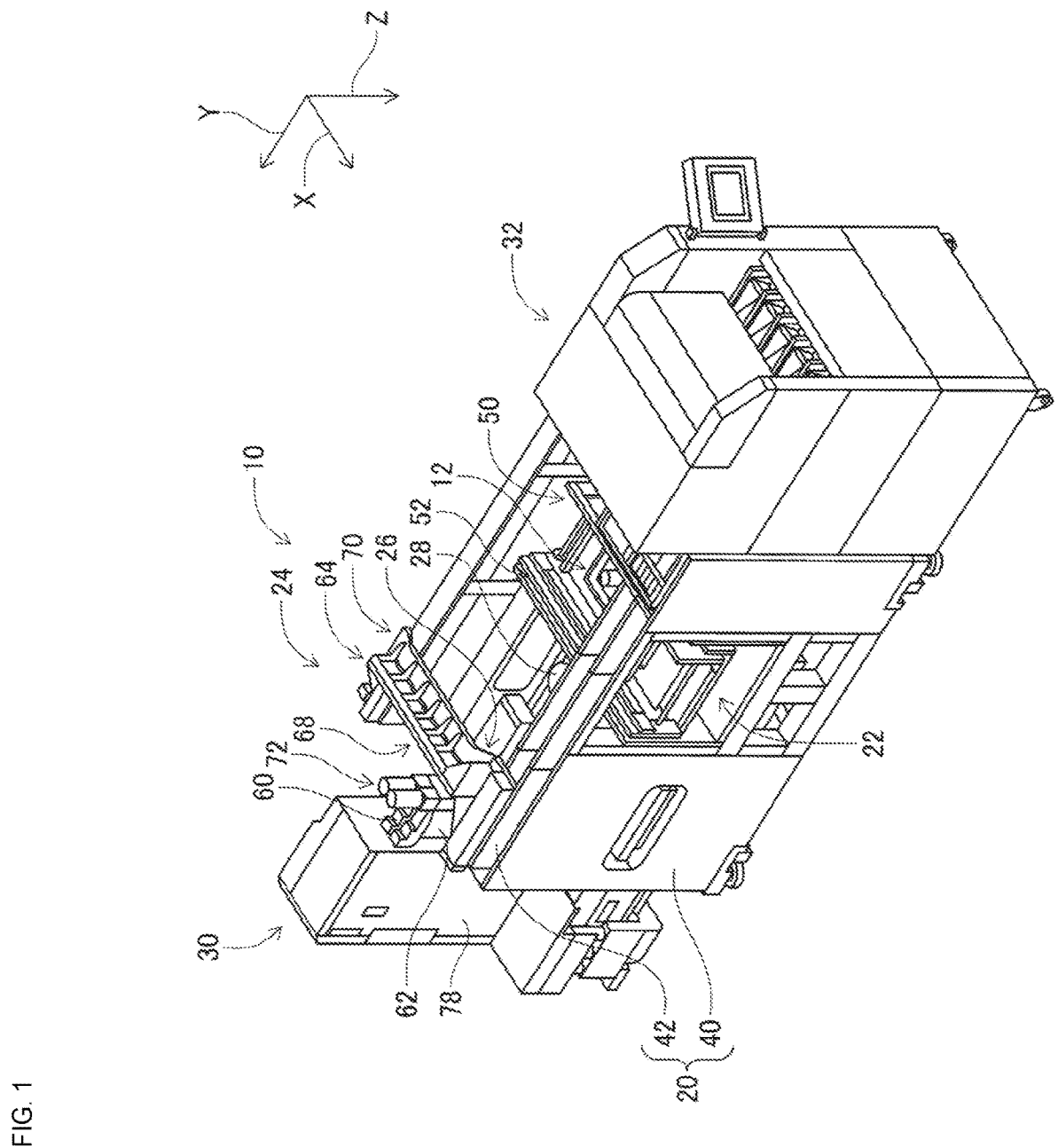
FIG. 1 A perspective view of a component mounting machine.

FIG. 1 shows component mounting machine 10. Component mounting machine 10 is a device for executing the mounting operation of a component on circuit substrate 12. Component mounting machine 10 includes device main body 20, substrate conveyance and holding device 22, component mounting device 24, imaging devices 26, 28, component supply device 30, bulk component supply device 32, and control device (see FIG. 11) 34. Examples of circuit substrate 12 include circuit boards, substrates having a three-dimensional structure, and the like; and examples of circuit boards include printed wiring boards, printed circuit boards, and the like.

Device main body 20 includes frame section 40 and beam section 42 which is overlaid on frame section 40. Substrate conveyance and holding device 22 is disposed at the center in the longitudinal direction of frame section 40 and has conveyance device 50 and clamping device 52. Conveyance device 50 is a device for conveying circuit substrate 12, and clamping device 52 is a device for holding circuit substrate 12. Thus, substrate conveyance and holding device 22 conveys circuit substrate 12 and holds circuit substrate 12 at a predetermined position in a fixed manner. In the following description, the conveyance direction of circuit substrate 12 is referred to as the X-direction, the horizontal direction perpendicular to this direction is referred to as the Y-direction, and the up-down direction is referred to as the Z-direction. In other words, the width direction of component mounting machine 10 is the X-direction and the front-rear direction is the Y-direction.

Figure 2:
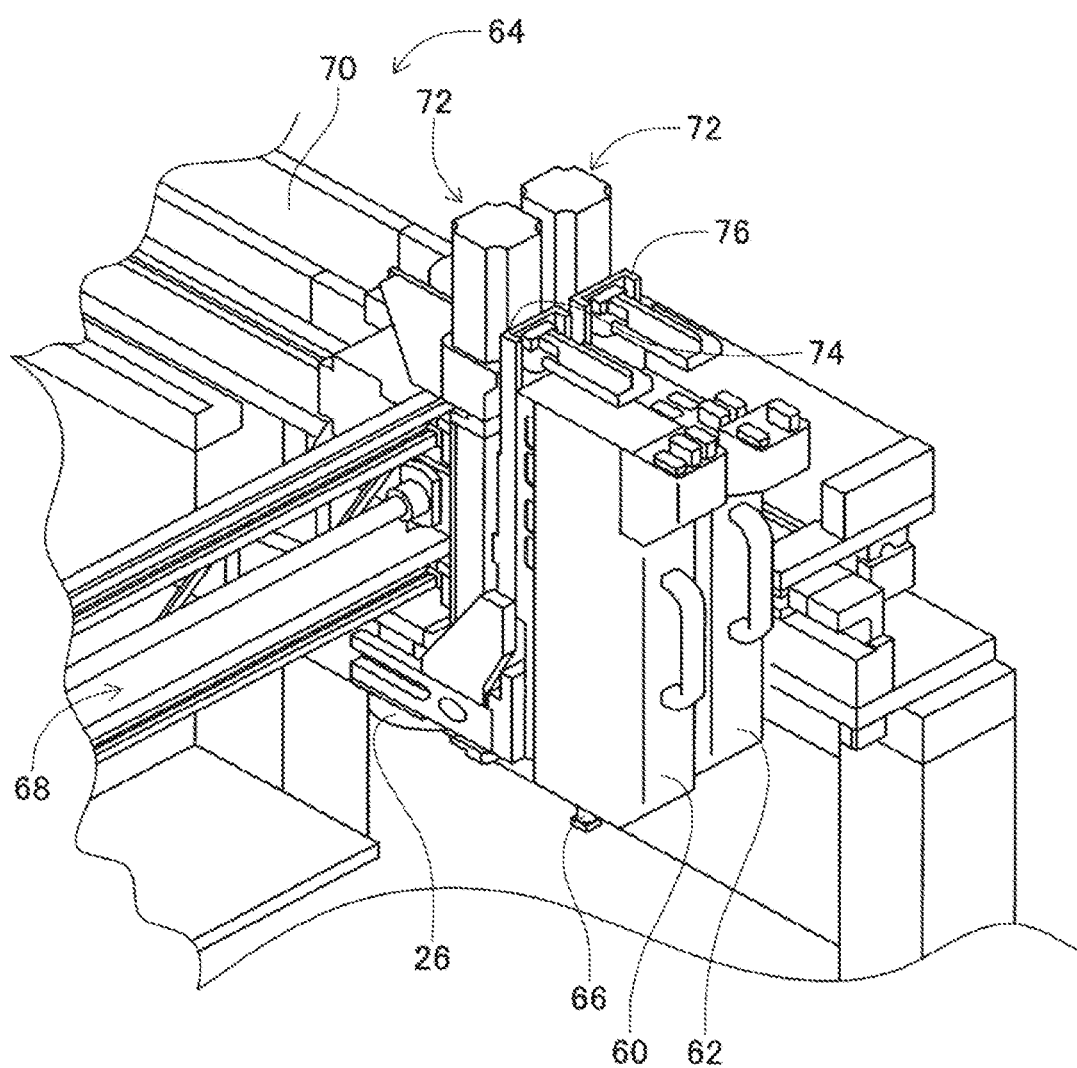
FIG. 2 A perspective view of a component mounting device of the component mounting machine.

Component mounting device 24 is disposed in beam section 42 and has two work heads 60, 62 and work head moving device 64. Each work head 60, 62 has suction nozzle (see FIG. 2) 66 and holds the component with suction nozzle 66. Further, work head moving device 64 has X-direction moving device 68, Y-direction moving device 70, and Z-direction moving device 72. Then, with X-direction moving device 68 and Y-direction moving device 70, two work heads 60, 62 are integrally moved to any position at the top of frame section 40. As shown in FIG. 2, work heads 60, 62 are detachably attached to sliders 74, 76 and Z-direction moving device 72 moves sliders 74, 76 individually in the up-down direction. That is, work heads 60, 62 are individually moved in the up-down direction by Z-direction moving device 72.

Imaging device 26 is attached to slider 74 in a downward-facing manner and is moved in the X-direction, Y-direction, and Z-direction together with work head 60. Thus, imaging device 26 images any position from above frame section 40. Imaging device 28, as shown in FIG. 1, is disposed between substrate conveyance and holding device 22 above frame section 40 and component supply device 30 in an upward-facing manner. Thus, imaging device 28 images components held by suction nozzles 66 of work heads 60, 62.

Component supply device 30 is disposed at one end of the longitudinal direction of frame section 40. Component supply device 30 has tray-type component supply device 78 and a feeder-type component supply device (not shown). Tray-type component supply device 78 is a device for supplying components placed on a tray to component mounting device 24. The feeder-type component supply device is a device for supplying components to component mounting device 24 with a tape feeder (not shown) or a stick feeder (not shown).

Bulk component supply device 32 is disposed at the other end in the longitudinal direction of frame section 40. Bulk component supply device 32 is a device for aligning multiple scattered components and supplying the aligned components. That is, bulk component supply device 32 is a device for aligning multiple components in any orientation in a predetermined orientation and supplying the components in the predetermined orientation. Hereinafter, the configuration of component supply device 32 will be described in detail. As examples of components to be supplied by component supply device 30 and bulk component supply device 32, generally there are odd-shaped components, and specifically there are electronic circuit components, solar cell constituent components, power module constituent components, and the like. Electronic circuit components include components with or without leads.

Figure 3:
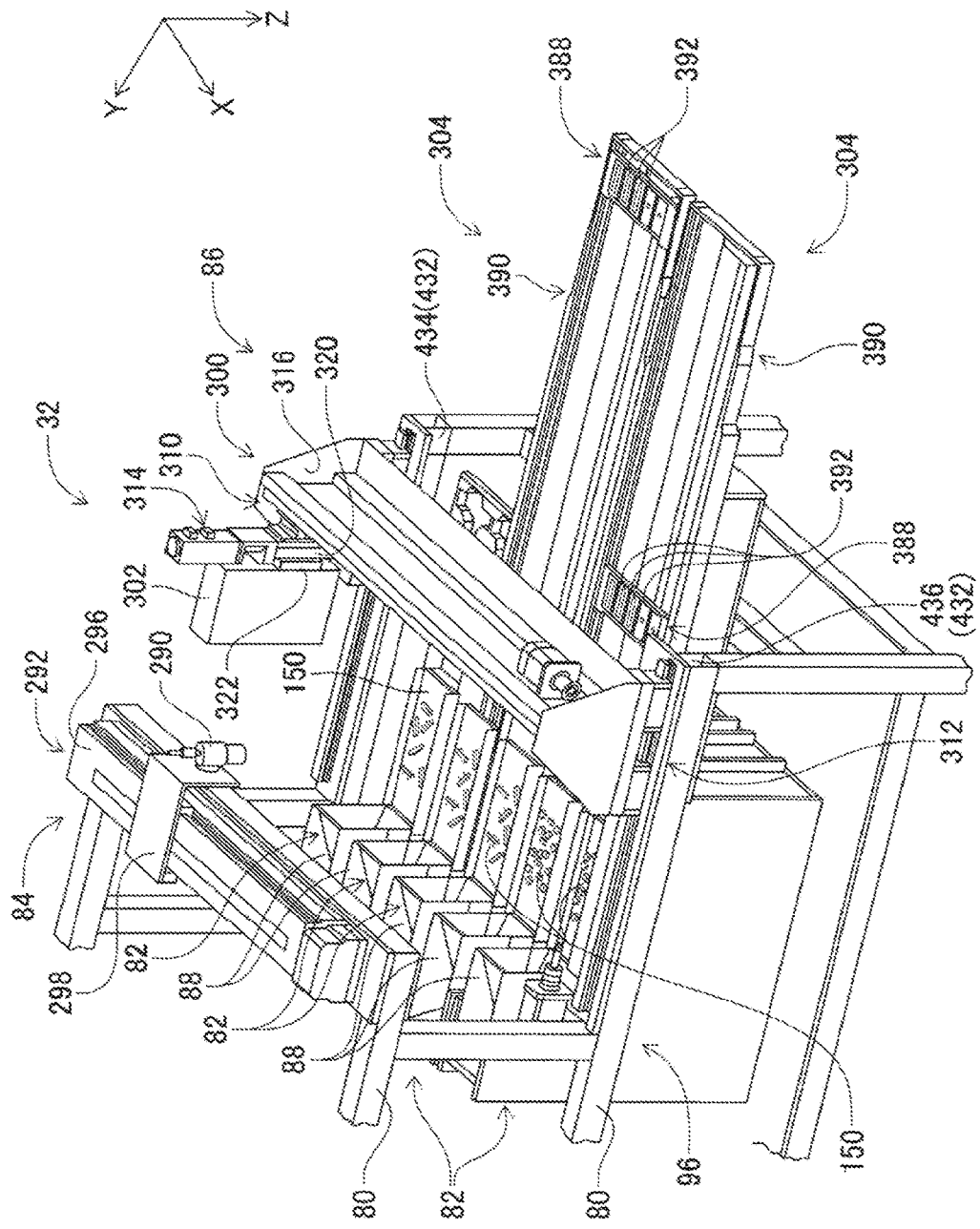
FIG. 3 A perspective view showing a bulk component supply device.

Bulk component supply device 32, as shown in FIG. 3, has main body 80, component supply unit 82, imaging device 84, and component delivery device 86.

(a) Component Supply Unit

Component supply unit 82 includes component feeder 88, component scattering device (see FIG. 4) 90, and component return device (see FIG. 4) 92, and component feeder 88, component scattering device 90, and component return device 92 are integrally configured. Component supply unit 82 is detachably assembled to base 96 of main body 80, and in bulk component supply device 32, five component supply units 82 are arranged side by side in a row in the X-direction.

Figure 4:
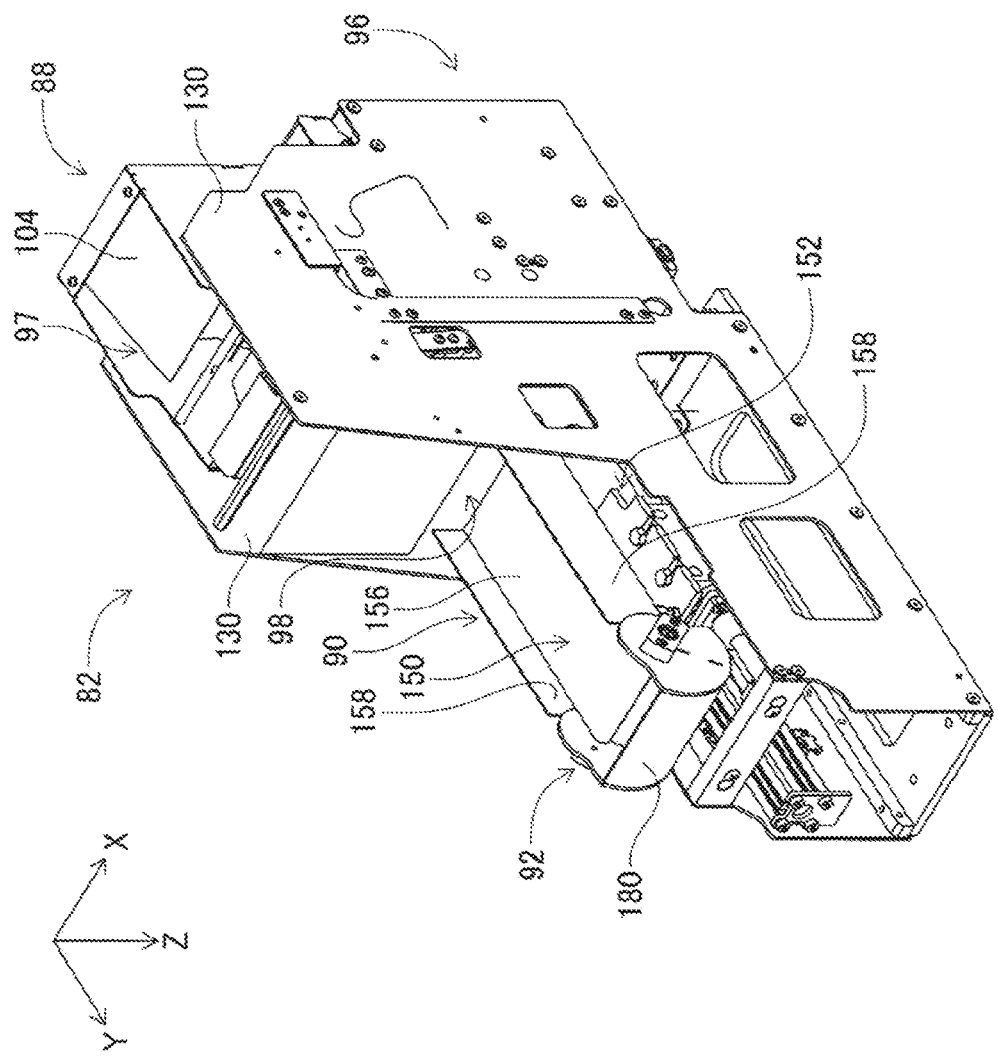
FIG. 4 A perspective view showing a component supply unit.
Figure 5:
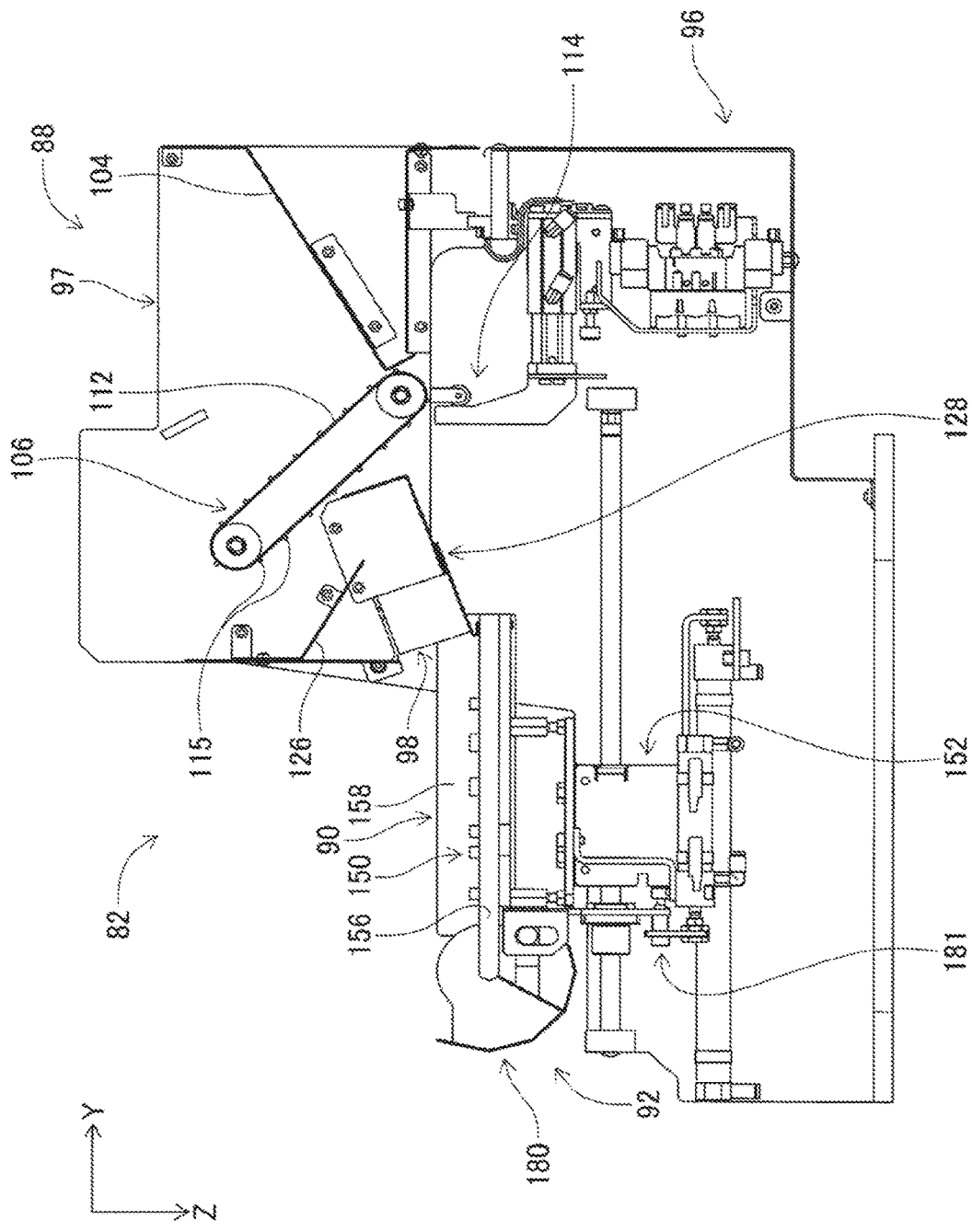
FIG. 5 A see-through view of the component supply unit.

Component feeder 88 has a box shape that is a generally rectangular parallelepiped, as shown in FIGS. 4 and 5, and is arranged so as to extend in the Y-direction. The Y-direction is described as the front-rear direction of component feeder 88, and in component supply unit 82, the direction toward the side in which component return device 92 is disposed is described as the forward direction, and the direction toward the side in which component feeder 88 is disposed is described as the rearward direction.

Component feeder 88 is open at the top and front faces, in which the opening at the top face is inlet 97 of the component, and the opening at the front face is discharge port 98 of the component. In component feeder 88, inclined plate 104 is disposed below inlet 97. Inclined plate 104 is disposed so as to be inclined downward toward the center from the end face at the rear of component feeder 88.

Further, conveyor device 106 is disposed in front of inclined plate 104, as shown in FIG. 5. Conveyor device 106 is disposed so as to be inclined upward from the front end of inclined plate 104 toward the front of component feeder 88. Conveyor belt 112 of conveyor device 106 rotates counterclockwise in FIG. 5. That is, the conveyance direction of conveyor device 106 is obliquely upward from the front end of inclined plate 104 to the front. Further, multiple protrusions 115 are formed on the surface of conveyor belt 112, that is, the conveyance surface, so as to extend along the width direction of conveyor belt 112. Multiple protrusions 115 are formed at constant intervals in the rotational direction of conveyor belt 112, and the interval is made longer than the longitudinal dimension of components supplied by component feeder 88.

Further, inclined plate 126 is disposed below the front end of conveyor device 106. Inclined plate 126 is disposed toward the lower side of conveyor device 106 from the front end face of component feeder 88, and the rear end is inclined obliquely downward. Furthermore, inclined plate 128 is disposed below inclined plate 126. Inclined plate 128 is inclined toward discharge port 98 of component feeder 88 from below the center portion of conveyor device 106 so that the front end of inclined plate 128 is positioned downward.

Further, a pair of side frame sections 130 are assembled on base 96, as shown in FIG. 4. The pair of side frame sections 130 are parallel to each other while facing each other and are erected so as to extend in the Y-direction. The distance between the pair of side frame sections 130 is slightly larger than the width of component feeder 88, and component feeder 88 is detachably attached between the pair of side frame sections 130.

Component scattering device 90 includes component support member 150 and component support member moving device 152. Component support member 150 is constituted by stage 156 and a pair of side wall sections 158. Stage 156 has a generally longitudinal plate shape and is disposed so as to extend forward from below component feeder 88 attached between the pair of side frame sections 130. Incidentally, the upper face of stage 156 is generally horizontal and is disposed, as shown in FIG. 5, with a slight clearance with respect to the front end of inclined plate 128 of component feeder 88. Further, the pair of side wall sections 158, as shown in FIG. 4, are erected on both sides in the longitudinal direction of stage 156 and fixed, and the upper edge of each side wall section 158 extends above the upper face of stage 156.

Figure 6:
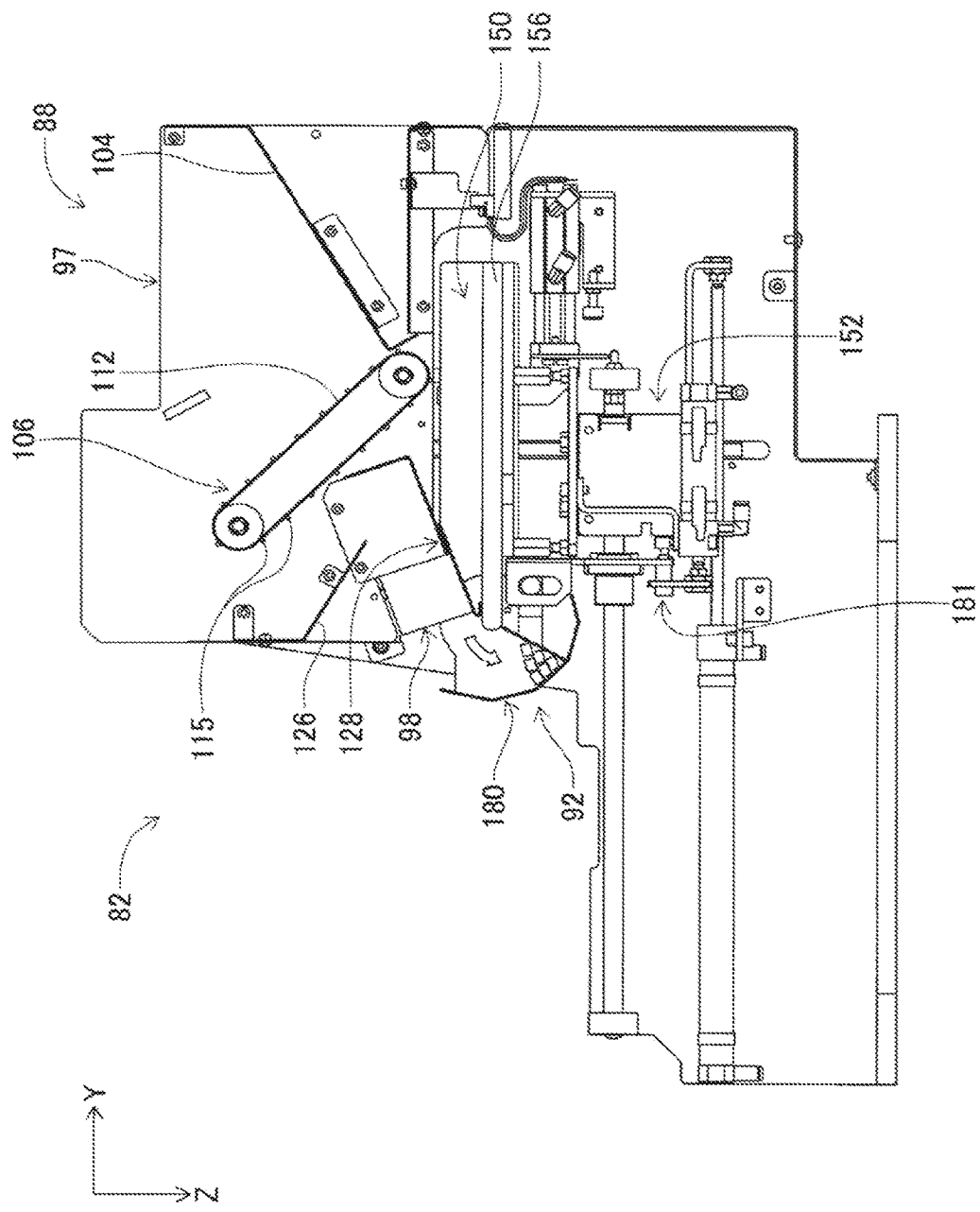
FIG. 6 A see-through view of a component supply unit.

Component support member moving device 152 slides component support member 150 in the Y-direction by way of operating air cylinder (refer to FIG. 11) 166. As this occurs, component support member 150 moves between a retracted state (refer to FIG. 6) in which component support member 150 is retracted underneath component feeder 88 and an exposed state (refer to FIG. 5) in which component support member 150 is exposed from underneath component feeder 88.

Figure 7:
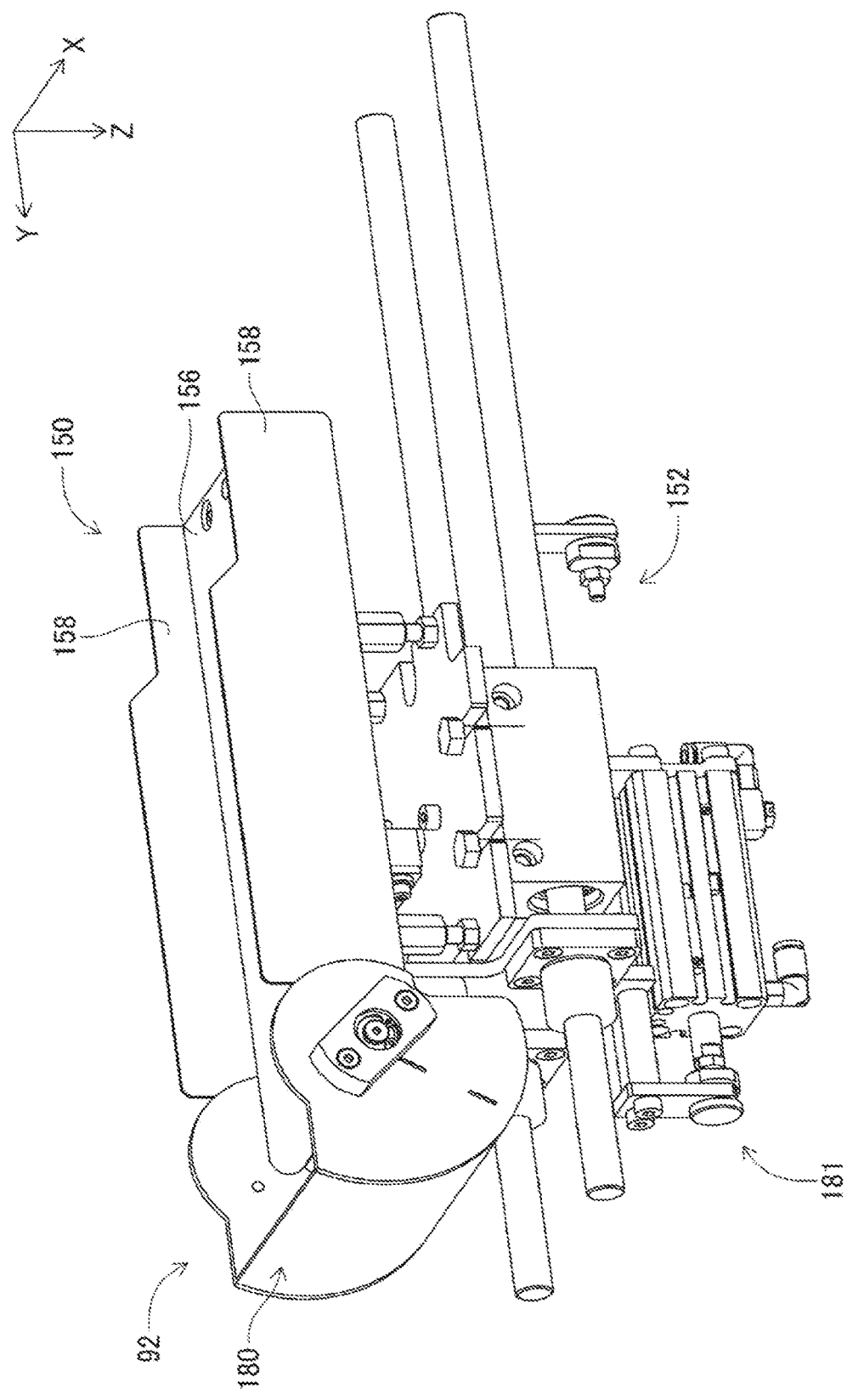
FIG. 7 A perspective view of a component scattering device.
Figure 8:
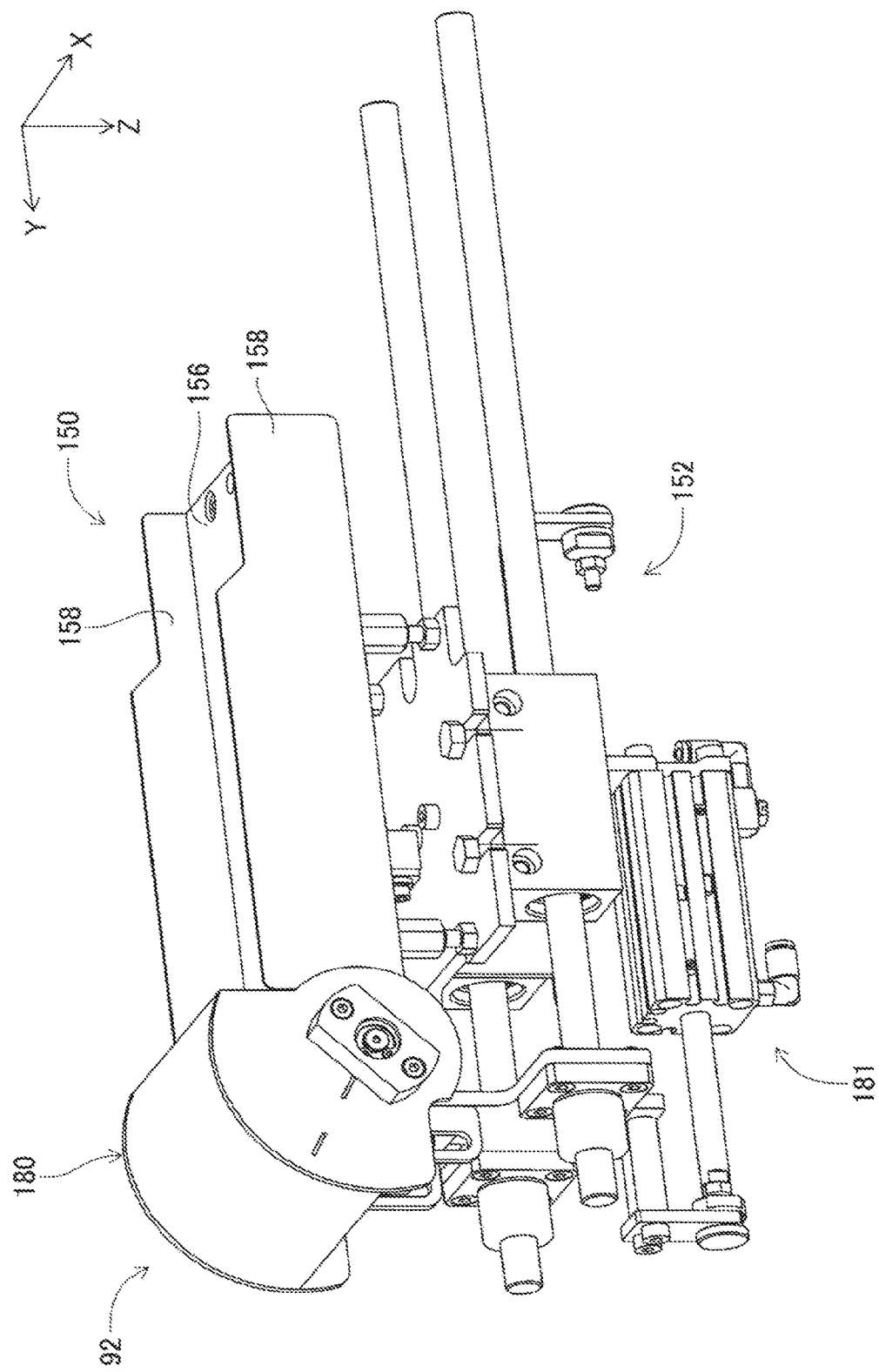
FIG. 8 A perspective view of the component scattering device.

As shown in FIG. 7, component return device 92 includes component accommodating container 180 and container swing device 181. Component accommodating container 180 has a generally box-like shape and an arc-shaped bottom surface. Component accommodating container 180 is held in a swingable manner at the front end of stage 156 of component supporting member 150 and swings by the operation of container swing device 181. At this time, component accommodating container 180 swings between an accommodating orientation in which the opening faces upward (refer to FIG. 7) and a return orientation in which the opening faces the upper surface of stage 156 of component support member 150 (see FIG. 8).

(b) Imaging Device

Imaging device 84, as shown in FIG. 3, includes camera 290 and camera moving device 292. Camera moving device 292 includes guide rail 296 and slider 298. Guide rail 296 is fixed to main body 80 above component feeder 88 so as to extend in the width direction (i.e., the X-direction) of bulk component feeder 32. Slider 298 is installed to guide rail 296 in a slidable manner and slides to any position by actuation of electromagnetic motor 299 (see FIG. 11). Further, camera 290 is attached to slider 298 in a downward-facing state.

(c) Component Delivery Device

Component delivery device 86 includes component holding head moving device 300, component holding head 302, and two shuttle devices 304, as shown in FIG. 3.

Component holding head moving device 300 includes X-direction moving device 310, Y-direction moving device 312, and Z-direction moving device 314. Y-direction moving device 312 has Y-slider 316 disposed above component supply unit 82 so as to extend in the X-direction and Y-slider 316 moves to any position in the Y-direction by the driving of electromagnetic motor (see FIG. 11) 319. X-direction moving device 310 has X-slider 320 disposed on a side face of Y-slider 316, and X-slider 320 moves to any position in the X-direction by the driving of electromagnetic motor (see FIG. 11) 321. Z-direction moving device 314 has Z-slider 322 disposed on a side face of X-slider 320, and Z-slider 322 moves to any position in the Z-direction by the driving of electromagnetic motor (see FIG. 11) 323.

Figure 9:
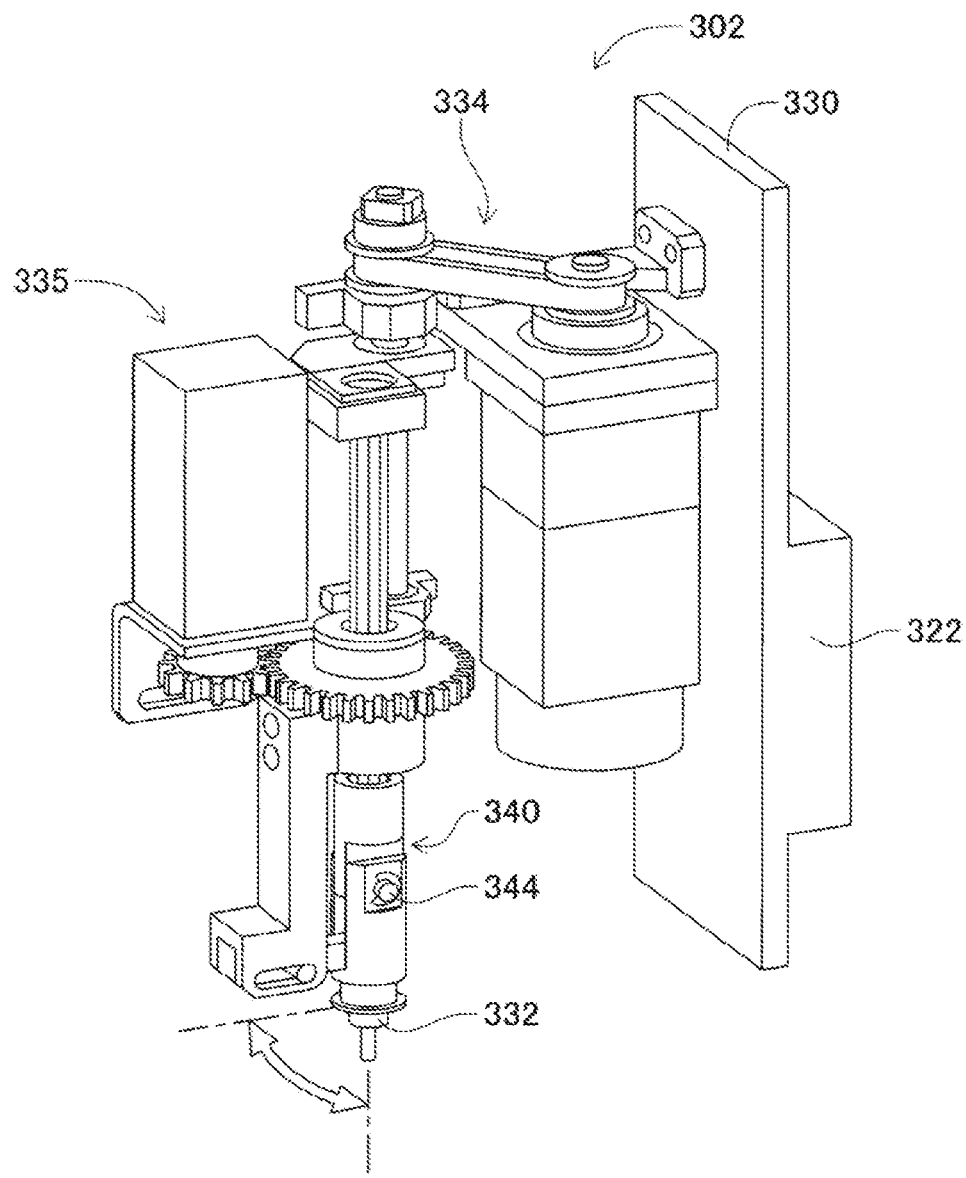
FIG. 9 A perspective view of a component holding head.

Component holding head 302 includes head main body 330, suction nozzle 332, nozzle pivoting device 334, and nozzle rotation device 335, as shown in FIG. 9. Head main body 330 is formed integrally with Z-slider 322. Suction nozzle 332 holds a component and is detachably attached to the lower end of holder 340. Holder 340 is bendable at support shaft 344, and through the operation of nozzle pivoting device 334, holder 340 is bent 90 degrees upward. Thus, suction nozzle 332 which is attached to the lower end of holder 340 is rotated 90 degrees and put into a pivoted position. That is, suction nozzle 332 pivots between a non-pivoted position and a pivoted position by actuation of nozzle pivoting device 334. Of course, it is also possible to position a stop at an angle between the non-turning position and the turning position. Nozzle rotation device 335 also rotates suction nozzle 332 about its axis.

Further, as shown in FIG. 3, two shuttle devices 304 each include component carrier 388 and component carrier moving device 390 and are fixed to main body 80 in such a manner as to be aligned side by side in a lateral direction ahead of component supply units 82. Component carrier 388 includes five component receiving members 392 arranged side by side in a row in the lateral direction, and components are placed individually in component receiving members 392.

Figure 10:
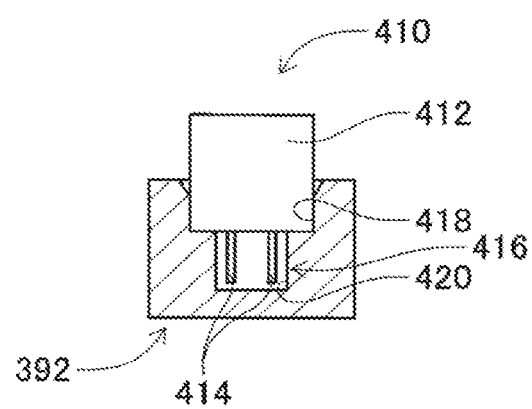
FIG. 10 A diagram showing a component receiving member in which a lead component is accommodated.

Bulk component supply device 32 can supply various types of components, and, hence, various types of component receiving members 392 are prepared so as to receive components of various configurations. Here, as an electronic circuit component supplied by bulk component supply device 32, as shown in FIG. 10, component receiving member 392 corresponding to lead component 410 having leads will be described. Lead component 410 consists of a block-shaped component main body 412 and two leads 414 protruding from the bottom face of component main body 412.

Component receiving member 392 has component receiving recessed section 416 having a shape corresponding to lead component 410. Component receiving recessed section 416 is a stepped-shaped recessed section and is composed of main body receiving recessed section 418, which opens to the upper face of component receiving member 392, and lead receiving recessed section 420, which opens to the bottom face of main body receiving recessed section 418. Lead component 410 is inserted into component receiving recessed section 416 with leads 414 facing downward. As a result, lead component 410 is placed inside component receiving recessed section 416 in a state in which leads 414 are inserted into lead receiving recessed section 420 and component main body 412 is inserted into main body receiving recessed section 418. That is, lead component 410 is placed inside component receiving member 392 such that the side faces of component main body 412 are positioned by main body receiving recessed section 418. The side faces of component main body 412 are faces extending upward from the bottom face of component main body 412 and intersect the bottom face of component main body 412. Further, the gap between component main body 412 and main body section receiving recessed section 418, that is, the distance between the inner wall face of main body section receiving recessed section 418 and the side face of component main body 412 is set to about 0.5 mm. As a result, it is possible to place multiple lead components 410 in multiple component receiving members 392 in a positioned manner.

Further, component carrier moving device 390, as shown in FIG. 3, is a plate-shaped elongated member disposed at the front of component supply unit 82 so as to extend in the front-rear direction. On the upper face of component carrier moving device 390, component carrier 388 is disposed so as to be slidable in the front-rear direction and slides to any position in the front-rear direction by the driving of electromagnetic motor (refer to FIG. 11) 430. Incidentally, when component carrier 388 slides in a direction approaching component supply unit 82, component carrier 388 slides to a component receiving position located within a range in which component holding head 302 is movable by component holding head moving device 300. On the other hand, when component carrier 388 slides in a direction away from component supply unit 82, component carrier 388 slides to a component supply position located within the range in which work heads 60, 62 are movable by work head moving device 64.

Further, detection sensor 432 is disposed in shuttle device 304. Detection sensor 432 detects the displacement in the up-down direction of lead component 410 placed in component receiving member 392, that is, the rising up of lead component 410 in component receiving recessed section 416 of component receiving member 392 (i.e., a state which arises from lead component 410 not being properly positioned in component receiving recessed section 416 of component receiving member 392), and is constituted by light emitting section 434 and light receiving section 436. Light emitting section 434 and light receiving section 436 are disposed at the ends of Y-direction moving device 312 and face each other across the two shuttle devices 304. Light emitted from light emitting section 434 is then received by light receiving section 436.

Figure 12:
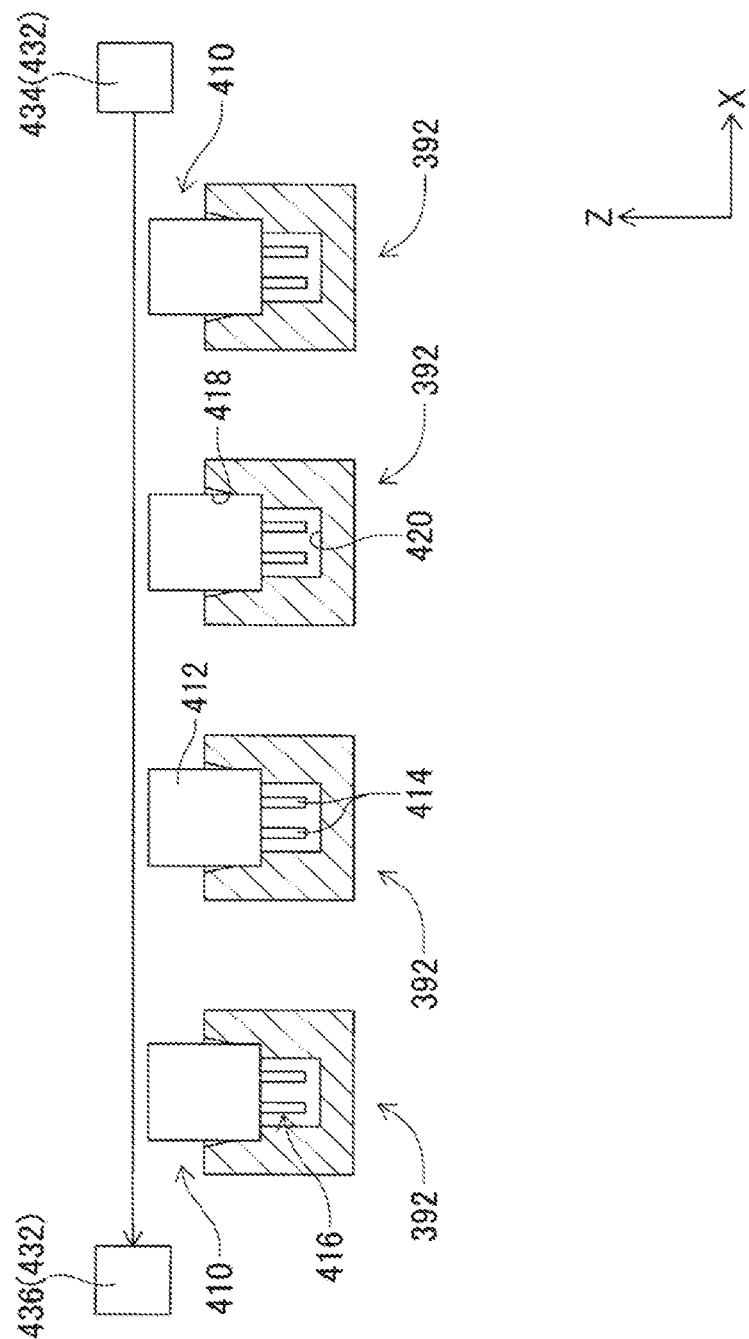
FIG. 12 A diagram showing a detection sensor for detecting displacement in the up-down direction of lead components placed in multiple component receiving members as viewed from a lateral viewpoint.

Further, light emitting section 434 and light receiving section 436 are arranged so that light passes over all component receiving members 392 of the two shuttle devices 304, and the displacement in the up-down direction of lead components placed in at least one or more component receiving members 392 of all component receiving members 392 is detected by detection sensor 432. Specifically, in all component receiving members 392 of the two shuttle devices 304, as shown in FIG. 12, since the delivery positions and heights of each of the multiple components are substantially the same, the heights of the upper faces of lead components 410 placed in component receiving recessed sections 416 are substantially the same to facilitate delivery. Here, substantially the same height is a height within a range in consideration of tolerances in lead components 410, component receiving members 392, and the like, and is, for example, a height of 0.5 mm in the up-down direction. Further, the upper surface of lead component 410 is a surface facing upward when lead component 410 is properly positioned and placed in component receiving recessed section 416 of component receiving member 392, and is, for example, the uppermost positioned surface of lead component 410 from a horizontal viewpoint when the surface facing upward is a stepped surface. However, so long as the upper surface of lead component 410 faces upward, it may be regarded as the upper surface, even if the surface is not the uppermost positioned surface of lead component 410. Incidentally, although there are in total ten component receiving members 392 in the two shuttle device 304, in the figure, only four component receiving members 392 are shown.

Figure 13:
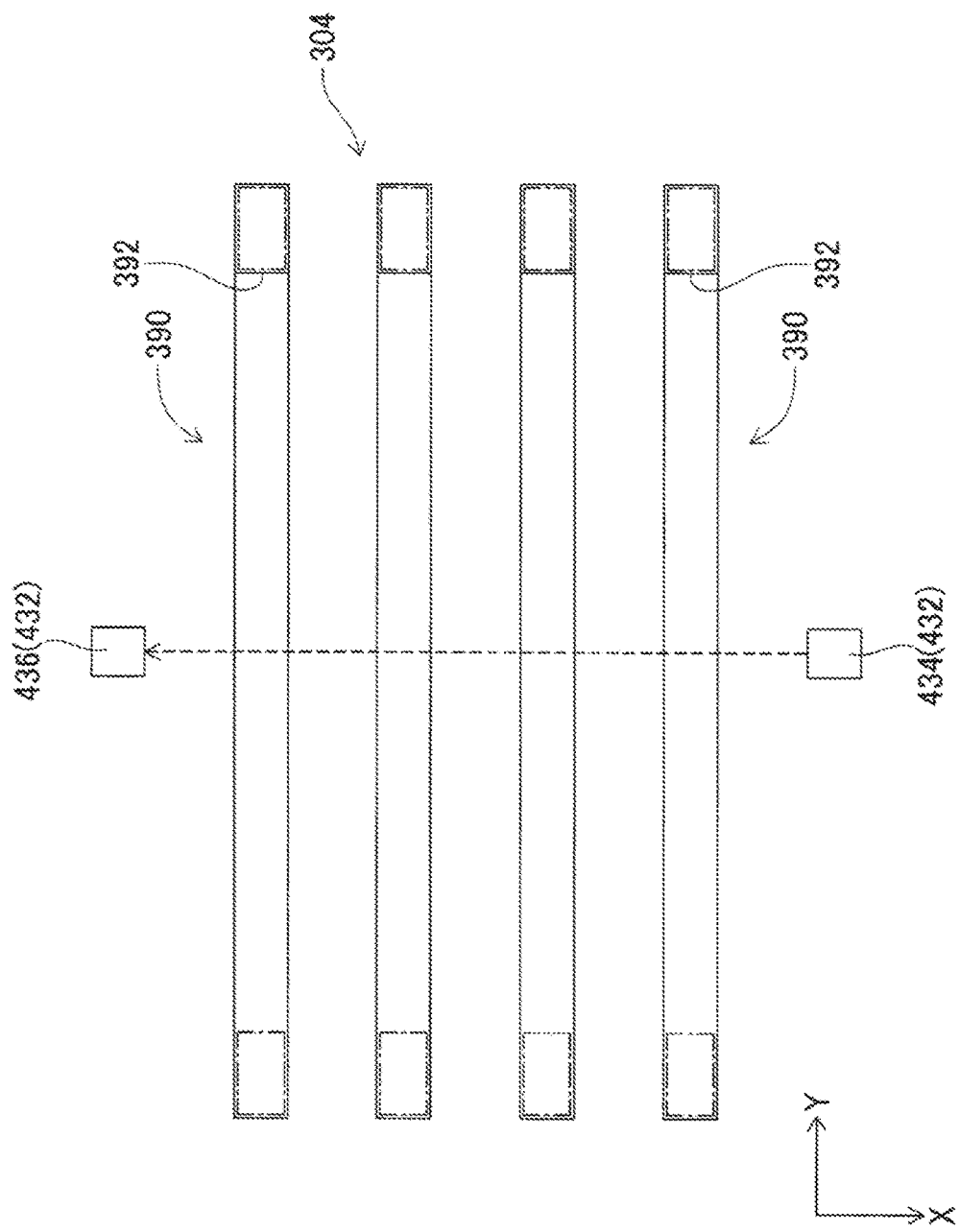
FIG. 13 A diagram showing the detection sensor for detecting displacement in the up-down direction of the lead component placed in multiple component receiving members as viewed from above.

Light emitting section 434 and light receiving section 436 are set slightly above, for example, 0.5 mm above, so that light passes above the upper surface of lead component 410 placed in component receiving member 392. Further, light emitting section 434 and light receiving section 436 are disposed so that light passes the vicinity of the center of component carrier moving device 390 in the extending direction, that is, the Y-direction, of component carrier moving device 390, as shown in FIG. 13.

Figure 14:
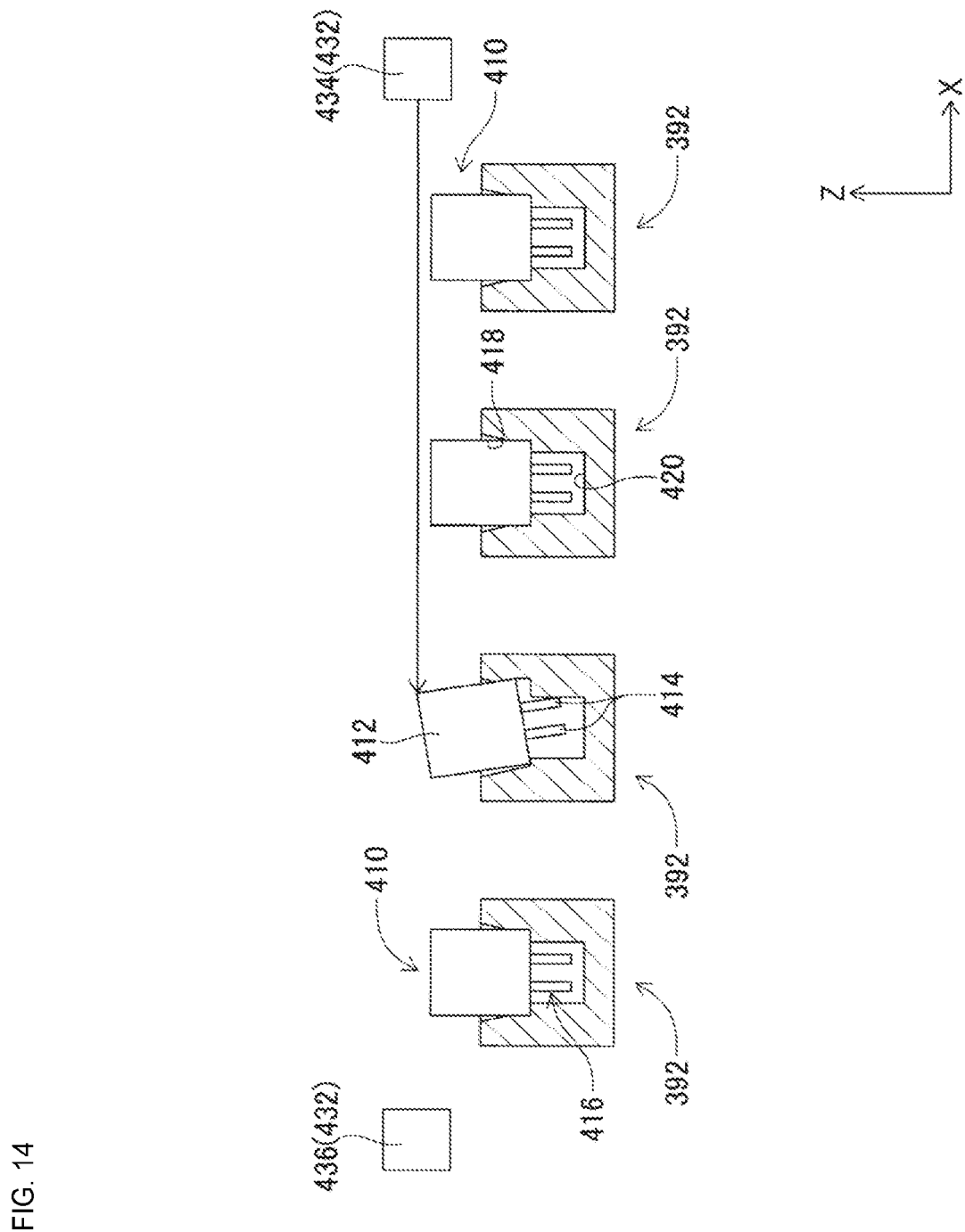
FIG. 14 A diagram showing the detection sensor for detecting displacement in the up-down direction of the lead component placed in multiple component receiving members as viewed from a lateral viewpoint.

With such a structure, when component receiving member 392, in which lead component 410 is placed, is moved from the component receiving position (i.e., the position indicated by the two-dot chain line in FIG. 13) to the component supply position (i.e., the position indicated by the one-dot chain line in FIG. 13), whether there has been displacement of the lead component in component receiving member 392 in the up-down direction is detected, the component receiving position being the position at which the lead component scattered on the stage is correctly positioned and placed in component receiving recessed section 416 of component receiving member 392, and the component supply position being the position at which the component positioned in component mounting device 24 is supplied. In other words, when lead component 410 placed in component receiving member 392 does not rise up in component receiving recessed section 416, the light emitted from light emitting section 434 is received by light receiving section 436 as shown in FIG. 12 and lead component 410 is determined to be properly positioned and placed. On the other hand, when lead component 410 placed in component receiving member 392 rises up in component receiving recessed section 416, the light emitted from light emitting section 434 is blocked by lead component 410 displaced upward or downward as shown in FIG. 14 and lead component 410 is determined not to be properly positioned and placed. Incidentally, the displacement in the up-down direction of lead component 410 occurs due to lead component 410 rising up in component receiving recessed section 416, and there are cases in which the entire body of lead component 410 rises up as well as cases in which a portion of lead component 410 rises up. These often result from lead component 410, scattered on the stage, not being positioned properly when placed in component receiving recessed section 416 of component receiving member 392, or from a load, such as a moving acceleration, applied to the component, which accompanies movement of component receiving member 392 even when the component is properly placed in component receiving recessed section 416 of component receiving member 392.

In other words, when light receiving section 436 receives the light emitted from light emitting section 434, it is possible to determine that lead component 410 placed in component receiving member 392 is not displaced in the up-down direction and is accommodated in component receiving recessed section 416 in a proper orientation. On the other hand, when light receiving section 436 does not receive the light emitted from light emitting section 434, lead component 410 placed in component receiving member 392 is displaced in the up-down direction, and lead component 410 is accommodated in component receiving recessed section 416 with the upper surface at an inclined orientation. Thus, in shuttle device 304, depending on whether light receiving section 436 receives light, it is determined whether lead component 410 is accommodated in a proper orientation in component receiving member 392. Further, in shuttle device 304, whether the lead component is accommodated in the proper orientation in all component receiving members 392 of the two shuttle devices 304 is detected by one detection sensor 432. Thus, it is possible to reduce the cost, save space, and the like. Furthermore, in all component receiving members 392 of the two shuttle devices 304, the heights of the upper faces of lead components 410 placed in component receiving recessed sections 416 are substantially the same. As a result, it is possible to appropriately determine whether the lead components placed in all component receiving members 392 are properly accommodated in component receiving recessed sections 416 in the proper orientation.

Figure 11:
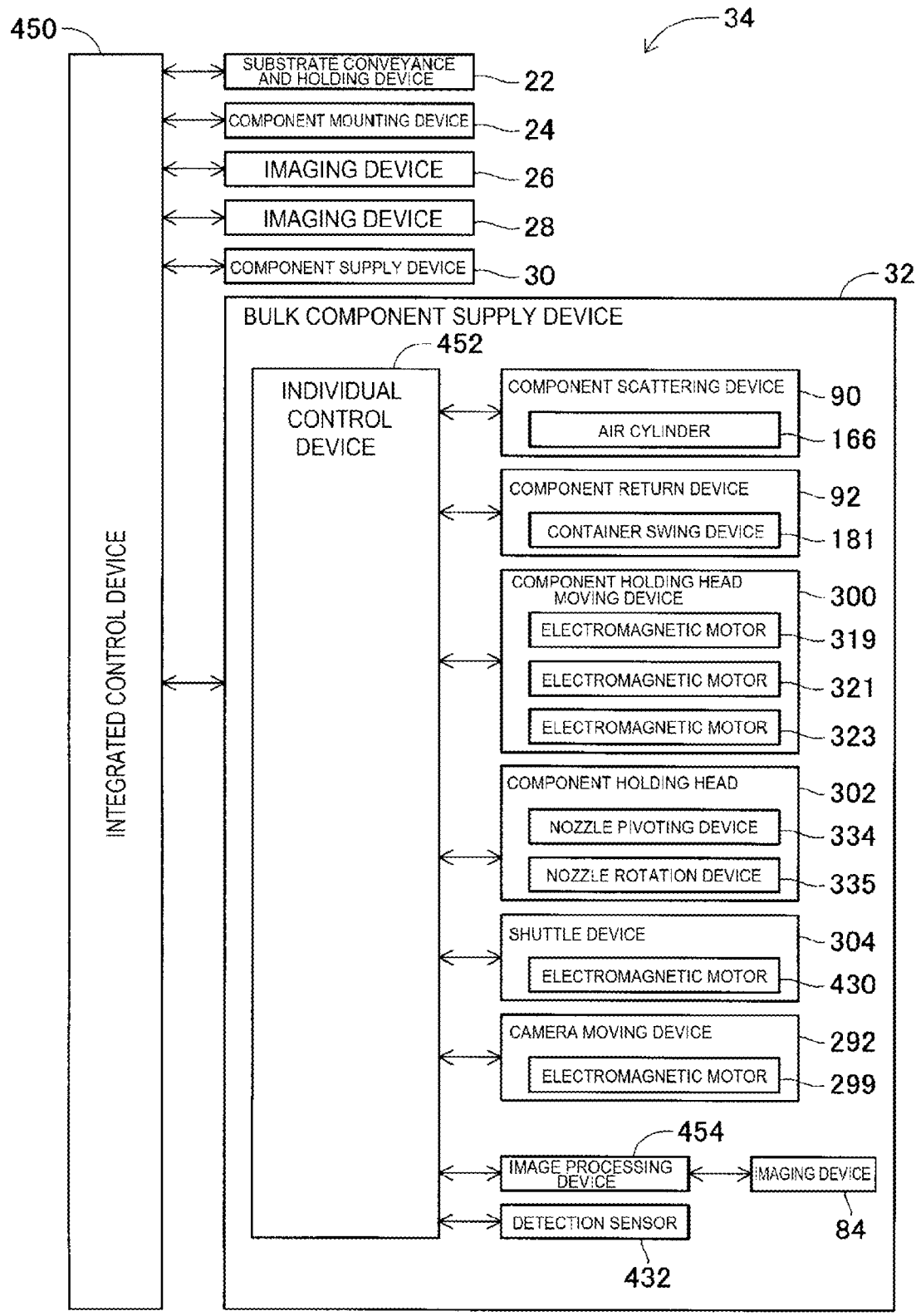
FIG. 11 A block diagram showing a control device of the component mounting machine.

Further, control device 34 includes integrated control device 450, multiple individual control devices (only one of which is shown in the drawing) 452, and image processing device 454, as shown in FIG. 11. Integrated control device 450 is composed mainly of a computer and is connected to substrate conveyance and holding device 22, component mounting device 24, imaging device 26, imaging device 28, component supply device 30, and bulk component supply device 32. As a result, integrated control device 450 collectively controls substrate conveyance and holding device 22, component mounting device 24, imaging device 26, imaging device 28, component supply device 30, and bulk component supply device 32. Multiple individual control devices 452 are each composed mainly of a computer and are provided to handle substrate conveyance and holding device 22, component mounting device 24, imaging device 26, imaging device 28, component supply device 30, and bulk component supply device 32 (in the figure, only individual control device 452 for handling bulk component supply device 32 is shown).

Individual control device 452 for bulk component supply device 32 is connected to component scattering devices 90, component return devices 92, camera moving device 292, component holding head moving device 300, component holding head 302, and shuttle devices 304. Thus, individual control device 452 for bulk component supply device 32 controls component scattering devices 90, component return devices 92, camera moving device 292, component holding head moving device 300, component holding head 302, and shuttle devices 304. Further, image processing device 454 is connected to imaging device 84 and processes the image data captured by imaging device 84. Image processing device 454 is connected to individual control device 452 for bulk component supply device 32. Thus, individual control device 452 for component supply device 32 acquires the image data captured by imaging device 84. Furthermore, individual control device 452 for bulk component supply device 32 is connected to detection sensor 432 and acquires the detection result from detection sensor 432.

(B) Operation of the Component Mounting Machine

With the configuration described above, component mounting machine 10 performs component mounting work on circuit substrate 12 held in substrate conveyance and holding device 22. Specifically, circuit substrate 12 is conveyed to a work position and held at that position in a fixed manner by clamping device 52. Next, imaging device 26 moves above circuit substrate 12 and images circuit substrate 12. In this way, information about the error in the holding position of circuit substrate 12 is obtained. Component supply device 30 or bulk component supply device 32 supplies a component at a predetermined supply position. Supplying of components by bulk component supply device 32 will be described in detail later. One of work heads 60, 62 is then moved above the component supply position and holds the component with suction nozzle 66. Subsequently, work head 60, 62 holding the component is moved above imaging device 28 and the component held with suction nozzle 66 is imaged by imaging device 28. This provides information on the error in the holding position of the component. Work head 60, 62 holding the component then moves above circuit substrate 12, the error in the holding position of circuit substrate 12, the error in the holding position of the component, and the like are corrected, and the component held is mounted on circuit substrate 12.

(C) Operation of the Bulk Component Supply Device

In bulk component feeder 32, lead components 410 are loaded from inlet 97 of component feeder 88 by an operator, and the loaded lead components 410, placed in component receiving members 392 of component carrier 388, are supplied by the operation of component supply unit 82 and component delivery device 86.

Specifically, the operator loads lead components 410 from inlet 97 at the upper face of component feeder 88. When this occurs, component support member 150 is moved into a retracted state underneath component feeder 88 by the operation of component support member moving device 152 (see FIG. 6). With component support member 150 in the retracted state, component storage container 180 disposed at the front end of component support member 150 is situated at the front of component feeder 88, assuming an orientation (an accommodating orientation) in which the opening of component accommodating container 180 is directed upwards.

Lead components 410 loaded from inlet 97 of component feeder 88 fall on inclined plate 104 of component feeder 88 and roll down to the lower front end of inclined plate 104. At this time, lead components 410 that have rolled down to the lower front end of inclined plate 104 accumulate between the lower front end of inclined plate 104 and the lower rear end of conveyor device 106. By operation of conveyor device 106, conveyor belt 112 of conveyor device 106 rotates counterclockwise in FIG. 6. At this time, a predetermined number of lead components 410 from lead components 410 accumulated between inclined plate 104 and conveyor belt 112 enter between adjacent protrusions 115 on conveyor belt 112, whereby the multiple lead components 410 are conveyed obliquely upwards by conveyor belt 112.

Lead components 410 conveyed by conveyor belt 112 then fall on inclined plate 126 from the upper front end of conveyor device 106. Lead components 410 which have fallen on inclined plate 126 roll down on inclined plate 126 toward the rear and fall on inclined plate 128. Lead components 410 which have fallen on inclined plate 128 roll toward the front and are discharged from discharge port 98 at the front of component feeder 88.

As a result, lead components 410 discharged from discharge port 98 of component feeder 88 are accommodated in component accommodating container 180. Then, when a predetermined amount of lead components 410 from component feeder 88 are discharged, that is, when conveyor device 106 has operated a predetermined amount, conveyor device 106 stops. Next, component support member 150 moves toward the front from the retracted state by the operation of component support member moving device 152.

Then, container swing device 181 of component return device 92 is activated to operate at a timing at which component support member 150 moves a predetermined amount from the retracted state to the front towards the exposed state, whereby component storage container 180 swings. As a result, the orientation of component accommodating container 180 changes vigorously from the orientation (i.e., the accommodating orientation) in which the opening is directed upward to the orientation (return orientation) in which the opening is directed toward stage 156. When this occurs, lead components 410 accommodated in component accommodating container 180 are discharged vigorously toward stage 156. As a result, lead components 410 are scattered from component accommodating container 180 onto stage 156. In addition, the swing action of the component accommodating container is set to complete before component support member 150 is completely exposed so as not to extend the cycle time.

When lead components 410 are scattered from component supplier 88 onto stage 156 of component support member 150 by following the procedure that has been described heretofore, camera 290 of imaging device 84 moves to a position above component support member 150 by operation of camera moving device 292 and images lead components 410. Then, for multiple lead components 410 scattered on the upper surface of component support member 150, information such as the positions on component support member 150, the orientations of lead components 410, and the like are calculated based on the imaging data.

Based on the calculated information on the positions of lead components 410, component holding head 302 is moved above a lead component by operation of component holding head moving device 300 and the lead component is picked up and held by suction nozzle 332. When a lead component is picked up and held by suction nozzle 332, suction nozzle 332 is positioned in the non-pivoting position.

Component holding head 302 then moves above component carrier 388 after lead component 410 is held by suction nozzle 332. At this time, component carrier 388 is moved to the component receiving position by the operation of component carrier moving device 390. Also, as component holding head 302 moves above component carrier 388, suction nozzle 332 is pivoted to the pivoting position. Incidentally, suction nozzle 332 is turned by the operation of nozzle rotation device 335 so that leads 414 of lead component 410 held in suction nozzle 332 in the pivoting position faces downward in the up-down direction.

As component holding head 302 moves above component carrier 388, lead component 410 with leads 414 facing downward in the up-down direction is inserted into component receiving recessed section 416 of component receiving member 392. As a result, lead component 410 is placed in component receiving member 392 with leads 414 directed downward in the up-down direction, as shown in FIG. 10.

When lead component 410 is placed in component receiving member 392, component carrier 388 is then moved to the component supply position by the operation of component carrier moving device 390. Component carrier 388, which has moved to the component supply position, supplies lead component 410 to component mounting machine 10 at this position in bulk component supply device 32 as the position is located within the moving range of work head 60, 62. In this way, in bulk component supply device 32, lead component 410 is supplied such that leads 414 face downward in component receiving member 392 and the upper face is directed upward, the upper face being the face facing the bottom face of leads 414 to which leads 414 connect. As a result, suction nozzle 66 of work head 60, 62 can properly hold lead component 410. Alternatively, even when a gripping chuck is attached to the work head, lead component 410 can be properly held by holding multiple surfaces that are perpendicular to the upper face.

However, in a state in which lead component 410 rises upward, that is, in a state in which lead component 410 is displaced in the up-down direction, as shown in FIG. 14, the upper face of lead component 410 is inclined in component receiving member 392. In such a state, lead component 410 cannot be properly held by suction nozzles 66 of work heads 60, 62. Therefore, as described above, detection sensor 432 determines whether lead component 410 placed in component receiving member 392 is displaced in the up-down direction in bulk component supply device 32. When it is then determined that lead component 410 placed in component receiving member 392 is not displaced in the up-down direction, component receiving member 392 supplies the lead component to the component supply position. On the other hand, when it is determined that lead component 410 placed in component receiving member 392 is displaced in the up-down direction, in the conventional method, the operation of bulk component supply device 32 is stopped and an error notification is made. As a result, the operator checks component receiving member 392 and corrects the displacement in the up-down direction of lead component 410 placed in component receiving member 392, such as collecting components in which displacement has occurred.

However, if the operation of bulk component supply device 32 is stopped in this way each time to confirm a displacement of lead component 410 placed in component receiving member 392, the operating ratio decreases. Taking this into consideration, when a displacement of lead component 410 placed in component receiving member 392 is confirmed with detection sensor 432, the displacement of the lead component in the up-down direction in component receiving member 392 is corrected by applying a vibration to component receiving member 392 with the operation of component carrier moving device 390.

Figure 15:
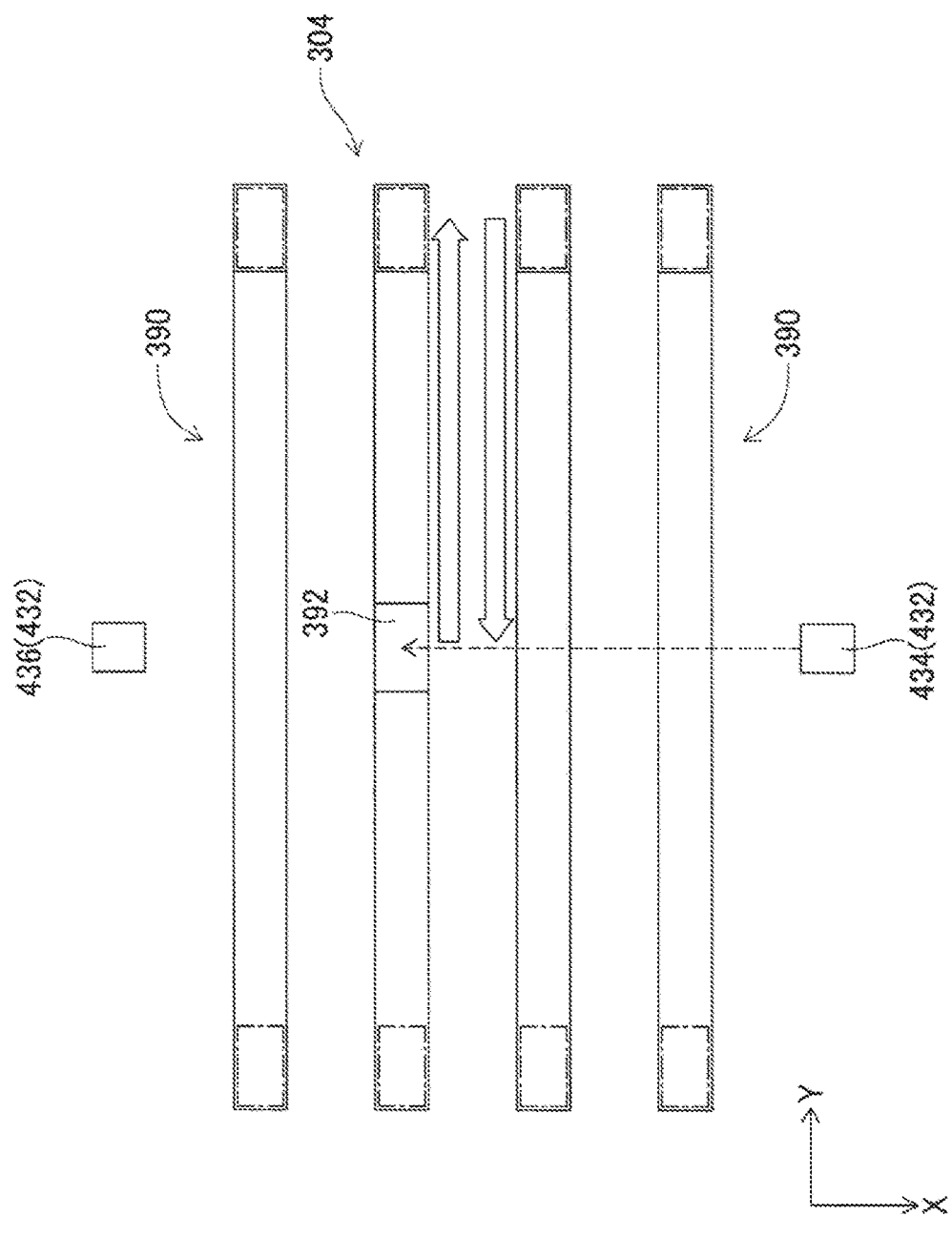
FIG. 15 A diagram showing the detection sensor for detecting displacement in the up-down direction of the lead component placed in multiple component receiving members as viewed from above.

Specifically, in shuttle device 304, when component receiving member 392 in which lead component 410 is placed slides toward the component supply position from the component receiving position, whether there is displacement of the lead component in component receiving member 392 is determined with detection sensor 432. At this time, when it is determined that the lead component in component receiving member 392 is displaced in the up-down direction, the sliding of component receiving member 392 toward the component supply position stops and reverses toward the component receiving position. Then, component receiving member 392 slides to the component receiving position and reverses at the component receiving position. Subsequently, component receiving member 392 slides toward the component supply position. Then, at a position along the way toward the component supply position, whether there is a displacement of the lead component in the up-down direction in component receiving member 392 is determined with detection sensor 432. That is, when it is determined that the lead component is displaced in the up-down direction in component receiving member 392, as shown in FIG. 15, component receiving member 392 is reciprocated once between the position where the displacement of the lead component is checked with detection sensor 432 and the component receiving position (the position of the two-dot chain line in the figure). There are cases in which, by performing this operation and applying an acceleration to component receiving member 392, the displacement of the lead component in the up-down direction in component receiving member 392 is corrected. By performing this operation, it is possible to perform the component supply operation in a stable manner without stopping the operation of bulk component supply device 32 and prevent the operation ratio from decreasing.

Incidentally, the sliding speed of component receiving member 392 for correcting the displacement of the lead component is slower than the normal sliding speed. That is, for example, when the sliding speed of component receiving member 392, for sliding from the component receiving position to the component supply position, is 1800 mm/s for the purpose of supplying components, the sliding speed of component receiving member 392 for correcting displacement of the lead component is less than 700 mm/s. As a result, it is possible to prevent a lead component from popping out even when an acceleration is applied to reciprocate component receiving member 392 in which a component is placed but is not properly positioned in component receiving recessed section 416 of component receiving member 392. The sliding speed of component receiving member 392 for correcting a displacement of a lead component is preferably about 20 to 30% of the normal sliding speed in order to appropriately suppress popping out of the lead component.

Further, it is possible that the displacement of the lead component will not be corrected even if a vibration is applied to component receiving member 392. That is, after it is determined that the lead component is displaced in the up-down direction with detection sensor 432, vibration is applied to component receiving member 392, the lead component may still be determined to be displaced in the up-down direction when it is determined again with detection sensor 432 whether the lead component is displaced. In such a case, the operation of bulk component supply device 32 is stopped and an error notification is made.

Bulk component supply device 32 is an example of a component supply device. Component receiving member 392 is an example of a placement section. Lead component 410 is an example of an electrical component. Component receiving recessed section 416 is an example of a positioning section. Detection sensor 432 is an example of a detection device.

It is to be noted that the present disclosure is not limited to the above examples and can be implemented in various modes subjected to various changes and improvements based on the knowledge of those skilled in the art. Specifically, for example, in the above embodiment, although detection sensor 432 is disposed in bulk component supply device 32, detection sensor may be disposed in a tray-type component supply device or a feeder-type component supply device. That is, a detection sensor may be disposed at a position at which the presence/absence of displacement in the up-down direction of multiple components placed in a row on a tray can be simultaneously detected. Further, a detection sensor may be disposed at a position at which the presence/absence of displacement in the up-down direction of multiple taped components can be simultaneously detected, the taped components being supplied from the supply position of multiple tape feeders. Also, by detecting the upper face height of multiple components to be supplied, it is possible to detect the positional displacement of the components to be supplied. That is, the present embodiment can be applied to various types of component supply devices.

Further, in the above embodiment, in order to correct the displacement of a component, component receiving member 392 slides back and forth one round trip between the position at which displacement of the lead component is confirmed with detection sensor 432 and the component receiving position, but component receiving member 392 may reciprocate through any distance and any number of times. That is, the component receiving member may be operated by acquiring the distance or number of times for sliding in which the likelihood of correcting the displacement of the component is high or acquiring the speed or acceleration based on practical experience, and then controlling the component receiving member accordingly. Alternatively, the component receiving member may be operated according to predetermined time periods and timings without using the detection with the detection sensor.

Further, in the above embodiment, although displacement of the component in the up-down direction is detected by detection sensor 432 using light, a laser, air, or the like may be used to detect displacement of the component in the up-down direction. The positions and timings at which the detection sensor performs detections can also be arbitrarily changed. In the embodiment, although the component receiving member is detected between the component receiving position and the component supply position, the component receiving member may be detected by placing a detection sensor at both the component receiving position and the component supply position so that detection may be performed at both of those positions, or a detection sensor may be placed at one of those positions.

Further, in the above embodiment, although the component is positioned by the recessed section in component receiving member 392, the component may be positioned by a protruding section.

Although the present disclosure is applied to lead component 410 in the above embodiment, the present disclosure can be applied to various types of components. The present disclosure can generally be applied to odd-shaped components, and specifically, for example, constituent components of solar cells, constituent components of power modules, electronic circuit components without leads, and the like.

REFERENCE SIGNS LIST

32: Bulk component supply device (component supply device), 392: Component receiving member (placement section), 410: Lead component (electrical component), 416: Component receiving recessed section (positioning section), 432: Detection sensor (detecting section)

The invention claimed is:

1. A component supply device, configured to supply an electrical component, comprising:
multiple placement sections, in which an electrical component positioned by a positioning section is placed, the placement sections each being movable in a conveyance direction, and
a detection device which is configured to detect displacement in an up-down direction of the electrical component being placed in the placement sections, the up-down direction being perpendicular to both the conveyance direction and a front-rear direction of the component supply device,
wherein the detection device includes a light emitting section that emits light and a light receiving section that receives the light, the light emitting section and the light receiving section facing each other in the front-rear direction.

2. The component supply device of claim 1, wherein the detection device detects the displacement in the up-down direction of the electrical component placed in the multiple placement sections using a laser or light.

3. The component supply device of claim 1, wherein the positioning section positions the electrical component, placed in each of the multiple placement sections, with respect to at least a lateral face of the electrical component.

4. The component supply device of claim 1, wherein the placement sections position and place the electrical component so that top surfaces of multiple electrical components placed in the placement sections have substantially a same height.

5. The component supply device of claim 1, further comprising:
a shuttle device configured to move at least one of the placement sections in the conveyance direction.

6. The component supply device of claim 1, wherein the placement sections each include a recessed section and the detection device detects if the electrical component is mispositioned in the recessed section in the up-down direction.

* * * * *